(12) United States Patent
Krasnov

(10) Patent No.: US 8,080,141 B2
(45) Date of Patent: Dec. 20, 2011

(54) ITO-COATED ARTICLE AND/OR METHOD OF MAKING THE SAME VIA HEAT TREATING

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 581 days.

(21) Appl. No.: 12/292,406

(22) Filed: Nov. 18, 2008

(65) Prior Publication Data

US 2010/0122900 A1 May 20, 2010

(51) Int. Cl.
*C23C 14/00* (2006.01)
(52) U.S. Cl. .............. 204/192.29; 204/192.15
(58) Field of Classification Search ............ 204/192.15, 204/192.29
See application file for complete search history.

(56) References Cited

U.S. PATENT DOCUMENTS

| | | | |
|---|---|---|---|
| 4,490,227 A | 12/1984 | Bitter | |
| 5,011,585 A | 4/1991 | Brochot et al. | |
| 5,650,597 A | 7/1997 | Redmayne | |
| 6,177,918 B1 | 1/2001 | Colgan et al. | |
| 6,204,897 B1 | 3/2001 | Colgan et al. | |
| 7,215,331 B2 | 5/2007 | Song et al. | |
| 7,372,510 B2 | 5/2008 | Abileah | |
| 7,436,393 B2 | 10/2008 | Hong et al. | |
| 2008/0225190 A1 | 9/2008 | Chen et al. | |

FOREIGN PATENT DOCUMENTS

| | | |
|---|---|---|
| EP | 1 671 783 | 6/2006 |
| EP | 1 921 633 | 5/2008 |

OTHER PUBLICATIONS

"Microstructure of Indium Tin Oxide Films Produced by the D.C. Sputtering Technique", Chaudhuri et al., Thin Solid Films, 148 (1987) pp. 279-284.

*Primary Examiner* — Christopher Young
(74) *Attorney, Agent, or Firm* — Nixon & Vanderhye P.C.

(57) ABSTRACT

Certain example embodiments of this invention relate to techniques for making a coated article including a transparent conductive indium-tin-oxide (ITO) film supported by a heat treated glass substrate. A substantially sub-oxidized ITO or metallic indium-tin (InSn) film is sputter-deposited onto a glass substrate at room temperature. The glass substrate with the as-deposited film thereon is subjected to elevated temperatures. Thermal tempering or heat strengthening causes the as-deposited film to be transformed into a crystalline transparent conductive ITO film. Advantageously, this may reduce the cost of touch panel assemblies, e.g., because of the higher rates of the ITO deposition in the metallic mode. The cost of touch-panel assemblies may be further reduced through the use of float glass.

37 Claims, 4 Drawing Sheets

ITO-COATED ARTICLE AND/OR METHOD OF MAKING THE SAME VIA HEAT TREATING

FIELD OF THE INVENTION

Certain example embodiments of this invention relate to indium tin oxide (ITO) coated articles, and/or methods of making the same. More particularly, certain example embodiments of this invention relate to techniques for sputter depositing a substantially sub-oxidized ITO or metallic indium-tin film from an InSn target onto a float glass substrate at or close to room temperature followed by its heat treatment to make an ITO coated article based on float glass substrate. The ITO coated articles may be built into touch panel display assemblies, for example.

BACKGROUND AND SUMMARY OF EXAMPLE EMBODIMENTS OF THE INVENTION

Touch panel displays are known. See, for example, U.S. Pat. Nos. 7,436,393; 7,372,510; 7,215,331; 6,204,897; 6,177,918; 5,650,597, the entire contents of each of which is hereby incorporated herein by reference. Indeed, a number of different types of touch panel displays currently are available including, for example, resistive and capacitive touch panel displays.

In general, capacitive touch screens comprise a thin conductive film between a pair of glass layers. A narrow pattern of electrodes is placed between glass layers. The conductive film may be, for example, patterned indium tin oxide (ITO) or a thin wire mesh. An oscillator circuit, generally attached to each corner of the screen, induces a low voltage electric field in the coating. When the glass screen is touched, the properties of the electric field change. The touch screen's controller is configured to compute the coordinates of the point of contact with the screen by measuring the relative changes of the electric field at a plurality of electrodes.

Similarly, resistive touch screens generally comprise a substantially rigid substrate and a flexible cover, each having a surface coated with a transparent conductive material, usually of indium tin oxide (ITO). The substrate and cover are bonded together with the conductive surfaces facing each other but separated by an air gap produced by a pattern of transparent insulators deployed on one of the surfaces. When a user presses on the flexible cover, the cover is deformed and the conductive surfaces make contact. A controller is configured to measure the voltage drop in circuits resulting from contact between the conductive layers to determine the coordinates of the point at which the contact was made.

Resistive and capacitive touch sensitive systems typically are provided as transparent touch-sensitive panels that are placed in front of the screen or display surface of the underlying electronic display. For example, touch sensitive systems commonly are used in connection with several types of displays including, for example, cathode ray tubes (CRTs) and liquid crystal displays (LCDs).

FIG. 1 is a cross-sectional view of a conventional resistive touch-panel assembly 100. A glass substrate 102 is provided. For display sizes of 15" in diagonal and larger, the glass substrate generally has a thickness of no less than 1.7 mm. In view of the above, it will be appreciated that one of the basic elements of a resistive or capacitive touch panel assembly is a glass substrate, coated with a first transparent conductive oxide layer 104, which typically is ITO. Additionally, the ITO coated glass substrate 102 is separated from another ITO coated article, e.g., via one or more spacers 106. The spacers 106 typically comprise a series of glass beads that often are substantially uniformly spaced apart, although other kinds of spacers sometimes may be used. Typically, this second ITO coated article is a flexible plastic film 108 such as, for example, polyethylene terephthalate (PET), which is coated with a second transparent conductive oxide layer 112 of ITO. The second transparent conductive oxide layer 112 is protected from the top with a hardcoat 110. The hardcoat 110 typically is provided as a substantially transparent layer that is both mechanically durable (e.g., is at least somewhat scratch resistant) and shows reduced markings when touched by a human hand. An LCD 114 or other suitable display device is provided "below" the glass substrate 102.

Although such touch panel displays have been made and have been commercially successful, further improvements are still possible. For example, the glass substrate used in such devices typically is expensive borosilicate, such as Corning glass. For many applications, the glass element of the touch-panel is reinforced by chemical treatment to increase tensile stress, which is a method alternative to thermal tempering of float soda-lime glass.

Additionally, the ITO layer typically is formed by sputter deposition in a reactive mode, e.g., when a metallic InSn target is bombarded by ionized argon in the presence of oxygen gas, thus coating the glass substrate with a substantially uniform and nearly stoichiometric ITO film. An alternative way to sputter indium tin oxide is to use a ceramic target, when the target is made of already stoichiometric ITO. In the latter case, the cost of the product is increased due to the higher cost of ceramic targets. However, the deposition rates of ITO in both cases, especially from ceramic targets, are known to be low, thus further increasing production costs.

Still further, to obtain a good quality of sputtered ITO, the substrate is normally heated during the deposition to 100-250 degrees C., which requires a special coater design.

Thus, it will be appreciated that there is a need in the art for techniques that improve the rates of the ITO coating for touch-panel displays. It also will be appreciated that there is a need in the art for making corresponding lower-cost ITO coated articles including a less expensive glass substrate, which may be heat strengthened or heat tempered. In any case, it will be appreciated that the techniques described herein may be used in connection with coated articles suitable for a wide variety of applications (e.g., other than touch panel display).

In certain example embodiments of this invention, a method of making a coated article is provided. A substantially transparent substrate is provided. A substantially sub-oxidized indium tin oxide (ITO) and/or metallic-mode indium-tin film is sputtered, directly or indirectly, on the substrate via an indium-tin (InSn) target. The sputtering is performed at or close to room temperature. The substrate together with the substantially sub-oxidized ITO and/or metallic-mode indium-tin film are heat treated such that the layer of substantially sub-oxidized ITO and/or metallic-mode indium-tin film is transformed into a substantially transparent and electrically conductive crystalline resultant ITO film.

In certain example embodiments, a method of making a coated article is provided. A substantially transparent soda-lime float glass substrate is provided. An intermediate film is sputtered, directly or indirectly, on the substrate via an indium-tin (InSn) target. The intermediate film comprises a substantially sub-oxidized indium tin oxide (ITO) and/or metallic-mode indium-tin film. The sputtering is performed at or close to room temperature. The substrate together with the intermediate film are heat strengthened or thermally tempered to produce an electrically conductive and crystalline resultant ITO film. The intermediate film comprises (InSn)$_x$O$_y$, with 0<y<0.5, and with x=1−y. The sputtering is performed in an environment having an oxygen-to-argon ratio of 0 to 0.4, more preferably 0 to 0.1.

In certain example embodiments, a method of making a touch panel display system is provided. A display panel (e.g., an LCD or other suitable display) is provided. A coated article comprising an ITO coating is provided, with the coated article having an intermediate film sputtered, directly or indirectly, on the substrate via an indium-tin (InSn) target. The intermediate film comprises a substantially sub-oxidized indium tin oxide (ITO) and/or metallic-mode indium-tin film. The sputtering is performed at or close to room temperature. The substrate and the intermediate film are heat treated to produce an electrically conductive and crystalline resultant ITO film. The intermediate film comprises (InSn)$_x$O$_y$, with 0<y<0.5, and with x=1−y. The sputtering is performed in an environment having an oxygen-to-argon ratio of 0 to 0.4, more preferably 0 to 0.1.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments of this invention relate to techniques for making a coated article including a transparent conductive oxide (TCO) layer of indium tin oxide (ITO), formed as a result of heat treatment in air of a substantially sub-oxidized ITO or metallic indium-tin film that has been sputter deposited on float soda-lime glass. More particularly, certain example embodiments relate to techniques for making a coated article including a transparent conductive indium-tin-oxide (ITO) film supported by a heat strengthened or tempered glass substrate for a touch-panel assembly. Initially, a substantially sub-oxidized ITO or metallic indium-tin (InSn) film is sputter-deposited onto a glass substrate at or close to room temperature. The glass substrate with the as-deposited film thereon is then subjected to elevated temperatures. Thermal tempering or heat strengthening causes the as-deposited film to be transformed into a crystalline transparent conductive ITO film. Advantageously, this results in a reduced cost of the assembly, e.g., because of the higher rates of the ITO deposition in the metallic mode. The cost of the touch-panel assembly is further reduced through the use of float glass.

Figure 1:
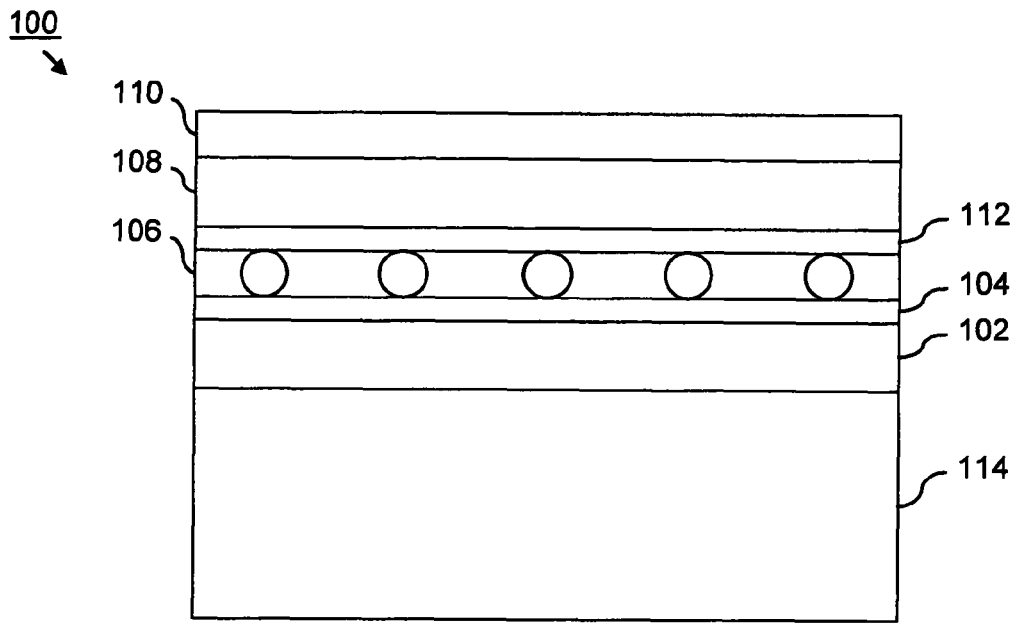
FIG. 1 is a cross-sectional view of a conventional resistive touch-panel assembly.
Figure 2:
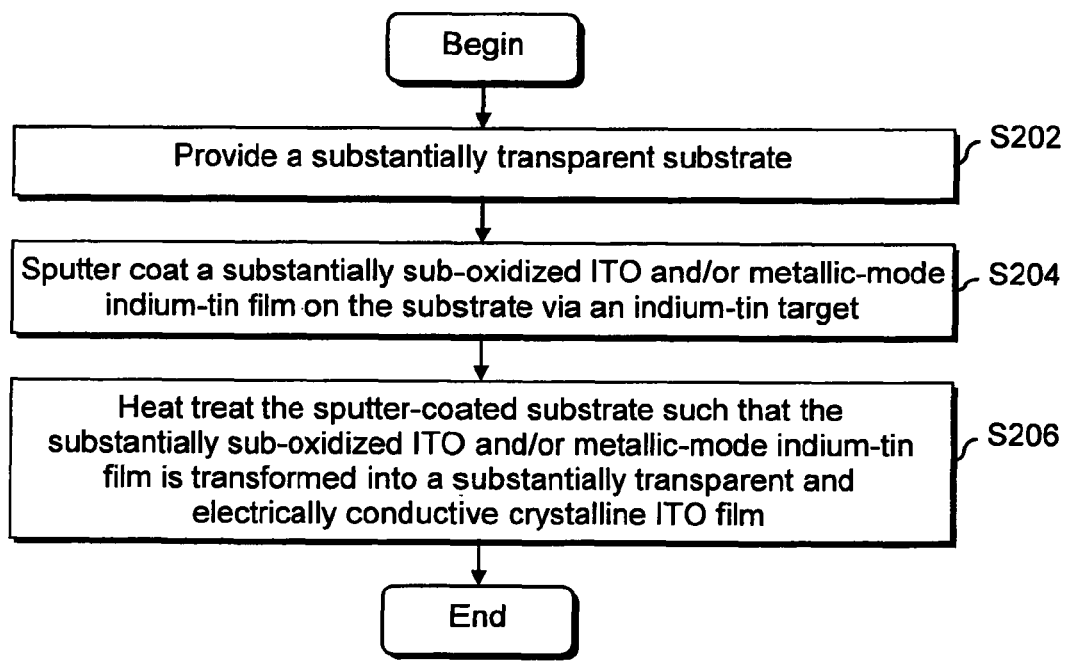
FIG. 2 is a flowchart showing an illustrative method for making a coated article in accordance with an example embodiment.

Referring now more particularly to the accompanying drawings in which like reference numerals indicate like parts/layers throughout the several views, FIG. 2 is a flowchart showing an illustrative method for making a coated article in accordance with an example embodiment. A substantially transparent substrate is provided in step S202. The substantially transparent substrate may, in certain example embodiments, be a glass substrate. More particularly, in certain example embodiments, the substantially transparent substrate may be a soda-lime float glass. Of course, other substantially transparent substrates may be used in connection with certain example embodiments. Indeed, in certain example embodiments, a float glass substrate with a reduced iron content may be used.

In step S204, a substantially sub-oxidized ITO and/or metallic-mode indium-tin film is deposited on the glass substrate via an indium-tin (InSn) target via sputtering. In certain example embodiments, the In/Sn ratio in the target may be from about 95/5 to 80/20, more preferably 90/10. The sputtering may be performed at or close to room temperature, e.g., at a temperature of about 17-25 degrees C., more preferably about 20 degrees C. The deposition process may take place in a variety of environments. For example, in certain example embodiments, the deposition process is carried out in a substantially pure Ar environment, whereas the deposition process may be carried out in an oxygen inclusive atmosphere (e.g., a mixture of oxygen and argon) in certain example embodiments. In the latter example, the oxygen-to-argon ratio may vary from about 0 to 1, more preferably from about 0 to 0.4, and still more preferably from about 0 to 0.1.

When sputter-deposited at or close to room temperature, the substantially sub-oxidized ITO or metallic InSn film is rather high with respect to visible light absorption and has a high sheet resistance. As explained in greater detail below, however, both visible light absorption and sheet resistance may be reduced following the heat treatment.

Figure 3:
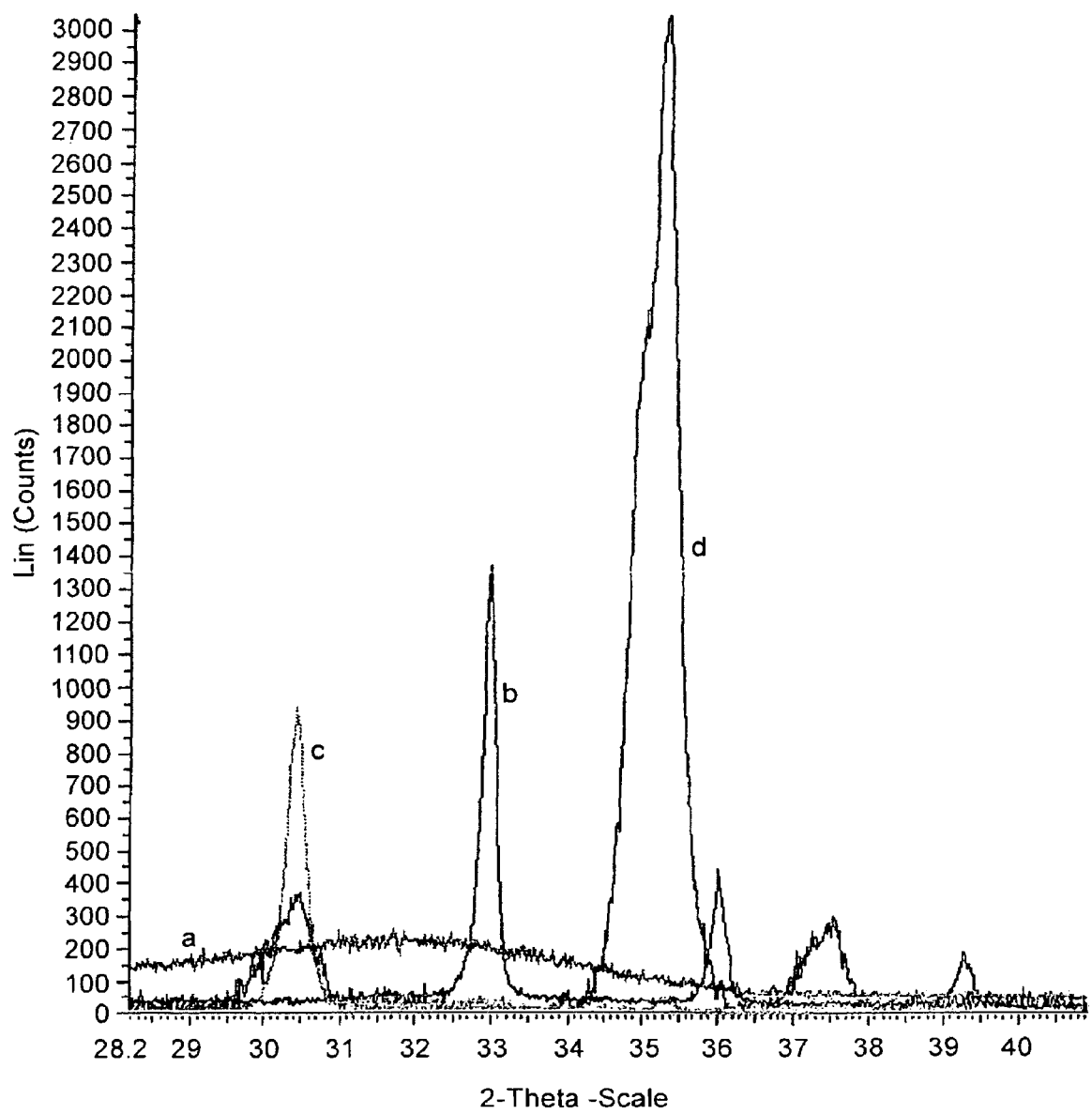
FIG. 3 is a graph showing x-ray defraction (XRD) of several example deposited materials in accordance with an example embodiment.

Depending on the initial composition of the target, the deposited material (e.g., the substantially sub-oxidized ITO or metallic InSn film) may be amorphous, a mixture of In and Sn, or have various orientations of ITO crystallites. In this regard, FIG. 3 is a graph showing x-ray diffraction (XRD) of several example deposited materials in accordance with an example embodiment. The graph in FIG. 3 is indicative of the crystalline orientation of deposited materials. Based on the "signatures" (e.g., the shape of the lines, including the photons or rays read out at particular angles, the width between peaks, etc.), (a) is indicative of an amorphous crystalline structure, (b) is indicative of a mixture of In and Sn, and (c) and (d) are indicative of various orientations of ITO crystallites. Thus, following sputtering, material generally comprising (InSn)$_x$O$_y$ will be deposited, with x=1−y, and with y ranging from about 0 to 0.5, more preferably 0.1 to 0.3, and still more preferably about 0.2.

It will be appreciated that in certain example embodiments, this intermediate film may be sputter deposited on one or more additional layers. For example, in one or more steps not shown, the intermediate film may be sputter coated on a buffer film such as, for example, a dielectric, which may be provided between the intermediate film and the glass substrate. This may be advantageous in certain example embodiments, as dielectrics such as silicon nitride or silicon oxynitride may help reduce the migration of elements from the glass (e.g., alkali elements from the soda lime glass) into the transparent conductive oxide (TCO) ITO layer.

In step S206, the sputter-coated glass substrate may be heat treated such that the substantially sub-oxidized ITO and/or metallic-mode indium-tin film is transformed into a substantially transparent and electrically conductive crystalline ITO film. In other words, the heat treating process may increase the oxidation of the previously deposited film. The heat treatments described herein include, for example, heat strengthening and thermal tempering. Thus, in certain example embodiments, the glass substrate with the as-deposited indium-tin or indium-tin-oxide film may be cut to an appropriate size and then thermally tempered at temperatures in excess of 600 degrees C., followed by air quenching, to form a conductive and transparent ITO film on strengthened glass substrate. The thermal tempering may involve heating the glass substrate with the as-deposited film thereon in a tempering furnace at a temperature of at least about 580 degrees C., more preferably at least about 600 degrees C., and often at least about 620 or 640 degrees C. The glass substrate with the film thereon may be in the tempering furnace for at least about 2 minutes, more preferably for at least about 5 minutes, in certain example embodiments of this invention.

Similarly, in certain example embodiments of this invention, the glass substrate with the as-deposited indium-tin or indium-tin-oxide film may be heat strengthened at temperatures around 600 degrees C. and then cut to sizes (or cut to size before the heat strengthening) to form a conductive and transparent ITO film on strengthened glass substrate.

Figure 4:
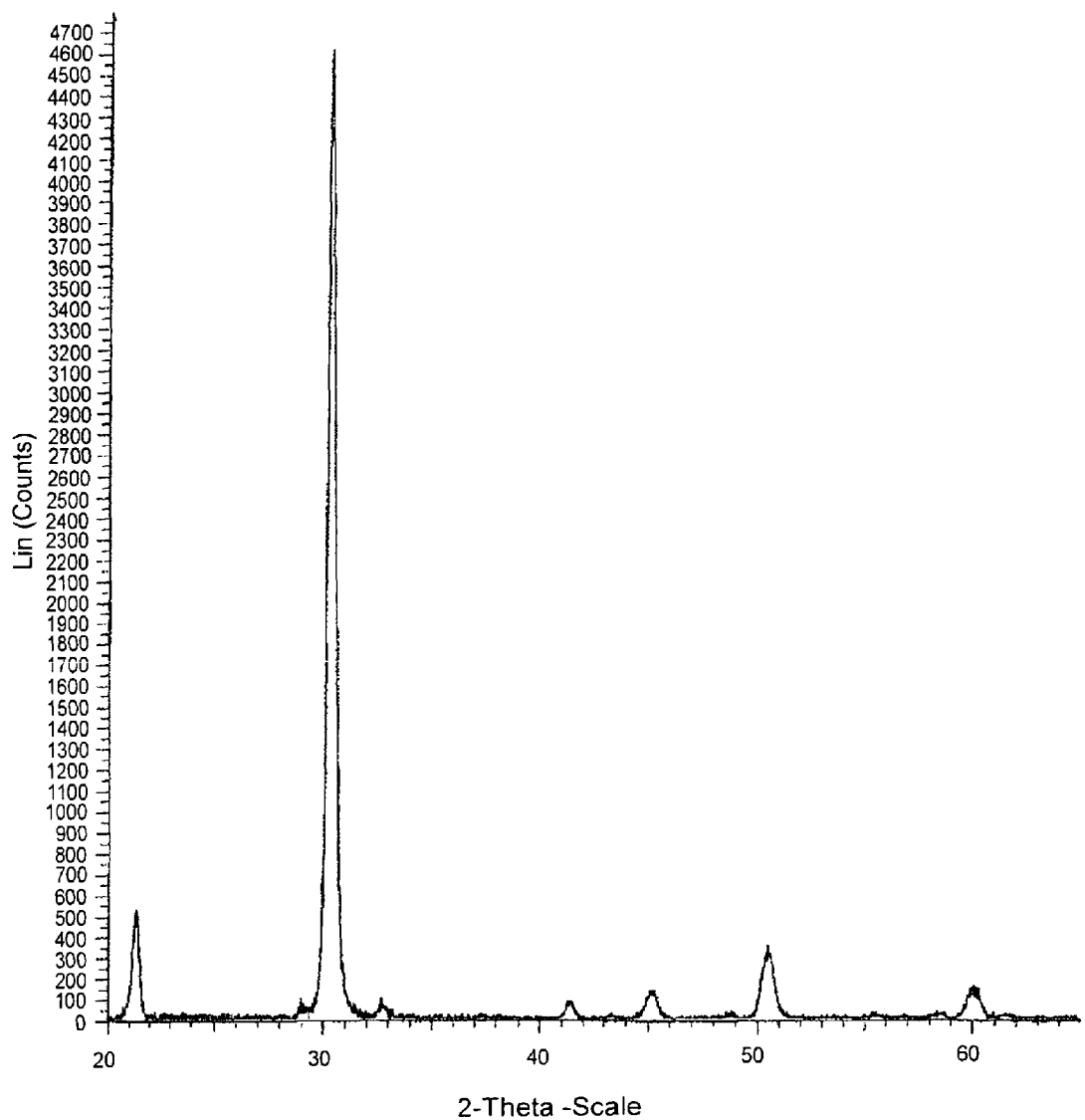
FIG. 4 is a graph showing x-ray defraction (XRD) of a deposited material following heat treatment in accordance with an example embodiment.
Figure 5:
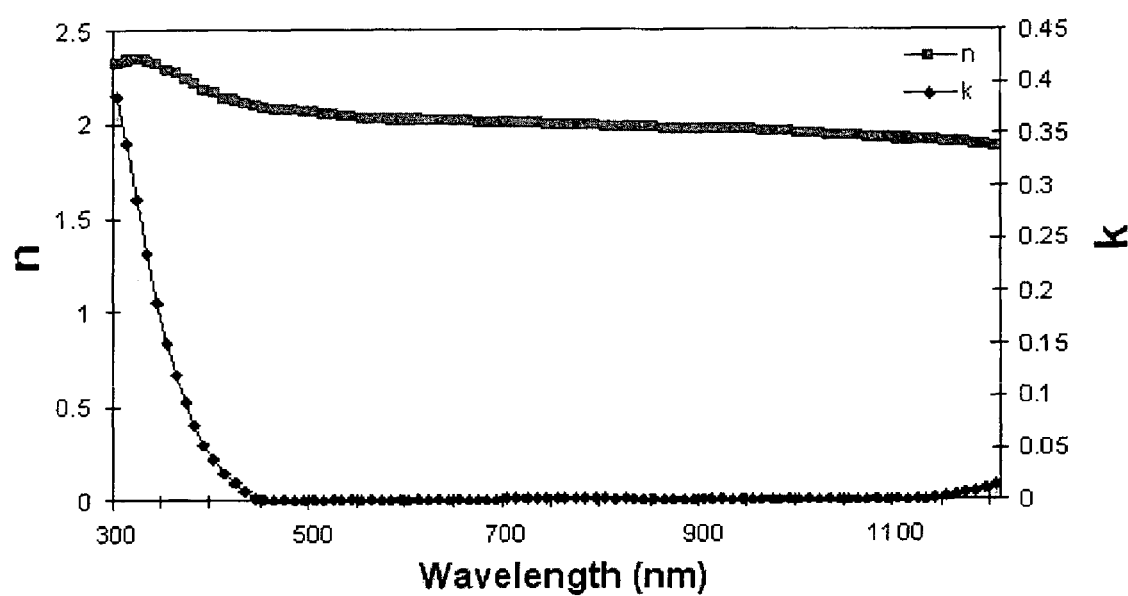
FIG. 5 is a graph showing optical constants of deposited material following heat treatment in accordance with an example embodiment.

The heat treatment (e.g., the thermal tempering or the heat strengthing) may cause the as-deposited film to be transformed into a crystalline transparent conductive film with optical constants similar to those of the presently produced ITO. For example, FIG. 4 is a graph showing x-ray defraction (XRD) of a deposited material following heat treatment in accordance with an example embodiment. The graph in FIG. 4 is similar to the crystalline structure typical of a TCO in general and ITO in particular. Additionally, FIG. 5 is a graph showing optical constants of deposited material following heat treatment in accordance with an example embodiment. In the FIG. 5 example, the refractive index (n) is about 2 throughout substantially all of the visible spectrum (e.g., from about 400-700 nm wavelengths) and even through the near infrared (NIR) spectrum (e.g., from about 700-1100 nm wavelengths), while the extinction coefficient (k) is high by drops sharply to values close to 0 throughout substantially all of the visible spectrum and even through the NIR spectrum. In other words, the damping or absorption effect of the ITO material, post heat treatment, is very low.

Indeed, in certain example embodiments, the refractive index (n) of the ITO preferably will be from about 1.8-2.2, while the extinction coefficient (k) of the ITO preferably will be less than about 0.5, more preferably less than about 0.3, and more preferably less than 0.2. As noted above, the sheet resistance and visible transmission of the ITO coating will be reduced. That is, in certain example embodiments, the sheet resistance will be reduced to less than about 70 ohms/square, more preferably less than about 50 ohms/square, while the visible transmission of the ITO (and/or any additional layers provided in connection therewith) will be at least about 70%, more preferably at least about 75%, and still more preferably at least about 80%.

Although a layer, film, or material may be said to be "on" or "supported by" another layer, film, or material, it will be appreciated that additional layers, films, and/or materials may be provided therebetween. In other words, a layer, film, or material may be said to be "on" or "supported by" another layer, film, or material without the two being located directly next to one another.

Additionally, although certain example embodiments have been described as relating to touch panel displays, it will be appreciated that the techniques described herein may be applied to other applications. For example, the techniques for depositing an intermediate film comprising a substantially sub-oxidized ITO and/or metallic-mode indium-tin film, directly or indirectly, on the substrate and then heat treating the intermediate film to produce a resultant film comprising ITO may be used in connection with a wide variety of applications.

While the materials shown for the various layers in the drawings are preferred materials in certain example embodiments of this invention, they are not intended to be limited unless expressly claimed. Other materials may be used to replace materials shown in the drawings in alternative example embodiments of this invention. Moreover, certain layers may be removed, and other layers added, in alternative embodiments of this invention. Likewise, the illustrated thicknesses also are not intended to be limiting unless expressly claimed.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article, the method comprising:
   providing a substantially transparent substrate;
   sputtering a substantially sub-oxidized indium tin oxide (ITO) and/or metallic-mode indium-tin film, directly or indirectly, on the substrate via an indium-tin (InSn) target, said sputtering being performed at or close to room temperature; and
   heat treating the substrate with the substantially sub-oxidized ITO and/or metallic-mode indium-tin film such that the layer of substantially sub-oxidized ITO and/or metallic-mode indium-tin film is transformed into a substantially transparent and electrically conductive crystalline resultant ITO film.

2. The method of claim 1, wherein the substrate is a reduced iron soda-lime float glass.

3. The method of claim 1, wherein following said sputtering, the substantially sub-oxidized indium tin oxide (ITO) and/or metallic-mode indium-tin film is either amorphous or partially crystalline.

4. The method of claim 1, wherein the InSn target has an In/Sn weight ratio is from 95/5 to 80/20.

5. The method of claim 1, wherein the resultant ITO film has a sheet resistance of less than about 70 ohms/square.

6. The method of claim 1, wherein the resultant ITO film has a sheet resistance of less than about 50 ohms/square.

7. The method of claim 1, wherein said heat treating is further practiced by thermally tempering the glass substrate with the amorphous or partially crystalline ITO film or InSn film at a temperature of at least about 600 degrees C.

8. The method of claim 1, wherein said heat treating is further practiced by heat strengthening the glass substrate with the amorphous or partially crystalline ITO film or InSn film at a temp of about 600 degrees C.

9. The method of claim 1, further comprising disposing a buffer layer between said substrate and said substantially sub-oxidized indium tin oxide (ITO) and/or metallic-mode indium-tin film.

10. The method of claim 9, wherein said buffer layer comprising a dielectric material.

11. The method of claim 1, further comprising disposing a layer comprising silicon nitride between said substrate and said substantially sub-oxidized indium tin oxide (ITO) and/or metallic-mode indium-tin film.

12. The method of claim 1, wherein the resultant ITO film has a visible transmission of at least about 70%.

13. The method of claim 1, wherein the resultant ITO film has a visible transmission of at least about 75%.

14. The method of claim 1, wherein said substantially sub-oxidized indium tin oxide (ITO) and/or metallic-mode indium-tin film comprises $(InSn)_xO_y$, wherein $0<y<0.5$, and wherein $x=1-y$.

15. The method of claim 1, wherein said substantially sub-oxidized indium tin oxide (ITO) and/or metallic-mode indium-tin film comprises $(InSn)_xO_y$, wherein $0.1<y<0.3$, and wherein $x=1-y$.

16. The method of claim 1, wherein said sputtering is performed in a substantially pure argon environment.

17. The method of claim 1, wherein said sputtering is performed in an environment having an oxygen-to-argon ratio of 0 to 0.4.

18. A method of making a coated article, the method comprising:
    providing a substantially transparent soda-lime float glass substrate;
    sputtering an intermediate film, directly or indirectly, on the substrate via an indium-tin (InSn) target, said intermediate film comprising a substantially sub-oxidized indium tin oxide (ITO) and/or metallic-mode indium-tin film, said sputtering being performed at or close to room temperature; and
    heat strengthening or thermally tempering the substrate together with the intermediate film to produce an electrically conductive and crystalline resultant ITO film,
    wherein said intermediate film comprises $(InSn)_xO_y$, wherein $0<y<0.5$, and wherein $x=1-y$, and
    wherein said sputtering is performed in an environment having an oxygen-to-argon ratio of 0 to 0.4.

19. The method of claim 18, further comprising disposing a dielectric buffer layer between said substrate and said intermediate film.

20. The method of claim 19, wherein the resultant ITO film together with the dielectric buffer layer has a visible transmission of at least about 70%.

21. The method of claim 18, wherein said sputtering is performed in an environment having an oxygen-to-argon ratio of 0 to 0.1.

22. A method of making an electronic device, the method comprising:
    providing a coated article comprising an ITO coating, the coated article having an intermediate film sputtered, directly or indirectly, on the substrate via an indium-tin (InSn) target, said intermediate film comprising a substantially sub-oxidized indium tin oxide (ITO) and/or metallic-mode indium-tin film,
    said sputtering being performed at or close to room temperature, the substrate and the intermediate film having been heat treated to produce an electrically conductive and crystalline resultant ITO film, wherein said intermediate film comprises $(InSn)_xO_y$, wherein $0<y<0.5$, and wherein $x=1-y$, and wherein said sputtering is performed in an environment having an oxygen-to-argon ratio of 0 to 0.4.

23. The method of claim 22, further comprising incorporating the coated article into the electronic device.

24. The method of claim 22, wherein said sputtering is performed in an environment having an oxygen-to-argon ratio of 0 to 0.1.

25. A method of making a coated article, the method comprising:
    providing a substantially transparent glass substrate;
    sputtering a film comprising substantially sub-oxidized indium tin oxide (ITO) and/or metallic-mode indium-tin, directly or indirectly, on the glass substrate via a target comprising indium and tin, said sputtering being performed at or close to room temperature; and
    heat treating the substrate with the film comprising substantially sub-oxidized ITO and/or metallic-mode indium-tin such that the substantially sub-oxidized ITO and/or metallic-mode indium-tin is transformed into a substantially transparent and electrically conductive crystalline resultant film comprising ITO.

26. The method of claim 25, wherein the substrate is a reduced iron soda-lime float glass.

27. The method of claim 25, wherein the target has an In/Sn weight ratio from 95/5 to 80/20.

28. The method of claim 25, wherein said film, after the heat treating, has a sheet resistance of less than about 70 ohms/square.

29. The method of claim 25, wherein the film, prior to the heat treating, comprises sub-oxidized ITO.

30. The method of claim 25, wherein said heat treating comprises thermally tempering the glass substrate at a temperature of at least about 600 degrees C.

31. The method of claim 25, further comprising forming, prior to the heat treating, a dielectric buffer layer between said glass substrate and said film.

32. The method of claim 25, wherein the resultant ITO film has a visible transmission of at least about 70%.

33. The method of claim 25, wherein said film prior to the heat treating comprises $(InSn)_xO_y$, wherein $0<y<0.5$, and $x=1-y$.

34. A method of making a coated article, the method comprising:
    having a substantially transparent glass substrate supporting a film comprising substantially sub-oxidized indium tin oxide (ITO) and/or metallic-mode indium-tin; and
    heat treating the glass substrate with the film comprising substantially sub-oxidized ITO and/or metallic-mode indium-tin such that the substantially sub-oxidized ITO and/or metallic-mode indium-tin is transformed into a substantially transparent and electrically conductive crystalline resultant film comprising ITO.

35. The method of claim 34, wherein the substrate is a reduced iron soda-lime float glass.

36. The method of claim 34, wherein said film, after the heat treating, has a sheet resistance of less than about 70 ohms/square.

37. The method of claim 34, wherein the film, prior to the heat treating, comprises sub-oxidized ITO.

* * * * *